(12) United States Patent
Reuveni et al.

(10) Patent No.: US 6,756,832 B2
(45) Date of Patent: Jun. 29, 2004

(54) DIGITALLY-PROGRAMMABLE DELAY LINE FOR MULTI-PHASE CLOCK GENERATOR

(75) Inventors: David R. Reuveni, Taufkirchen (DE); Stefan G. Block, Munich (DE)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/271,919

(22) Filed: Oct. 16, 2002

(65) Prior Publication Data

US 2004/0075481 A1 Apr. 22, 2004

(51) Int. Cl.[7] .............................................. H03H 11/26
(52) U.S. Cl. ...................................... 327/271; 327/272
(58) Field of Search ................................ 327/271, 272, 327/276, 277, 278, 281, 284, 285, 288, 149, 161; 375/376, 373; 331/25, DIG. 3

(56) References Cited

U.S. PATENT DOCUMENTS

| | | | | |
|---|---|---|---|---|
| 5,777,501 A | * | 7/1998 | AbouSeido | 327/274 |
| 5,945,935 A | * | 8/1999 | Kusumoto et al. | 341/159 |
| 6,252,443 B1 | * | 6/2001 | Dortu et al. | 327/156 |
| 6,411,142 B1 | * | 6/2002 | Abbasi et al. | 327/156 |
| 6,417,713 B1 | * | 7/2002 | DeRyckere et al. | 327/271 |

* cited by examiner

Primary Examiner—Linh M. Nguyen
(74) Attorney, Agent, or Firm—Westman, Champlin & Kelly

(57) ABSTRACT

A digitally programmable delay circuit is provided, which includes a control input and a plurality of delay stages coupled in series with one another to form a delay line. Each stage has a previous stage input, a previous stage output, a next stage input and a next stage output. The next stage output and the next stage input are coupled to the previous stage input and the previous stage output, respectively, of a next one of the delay stages in the delay line. The previous stage input is coupled to the next stage output. The previous stage input and the next stage input are selectively coupled to the previous stage output based on the control input.

17 Claims, 13 Drawing Sheets

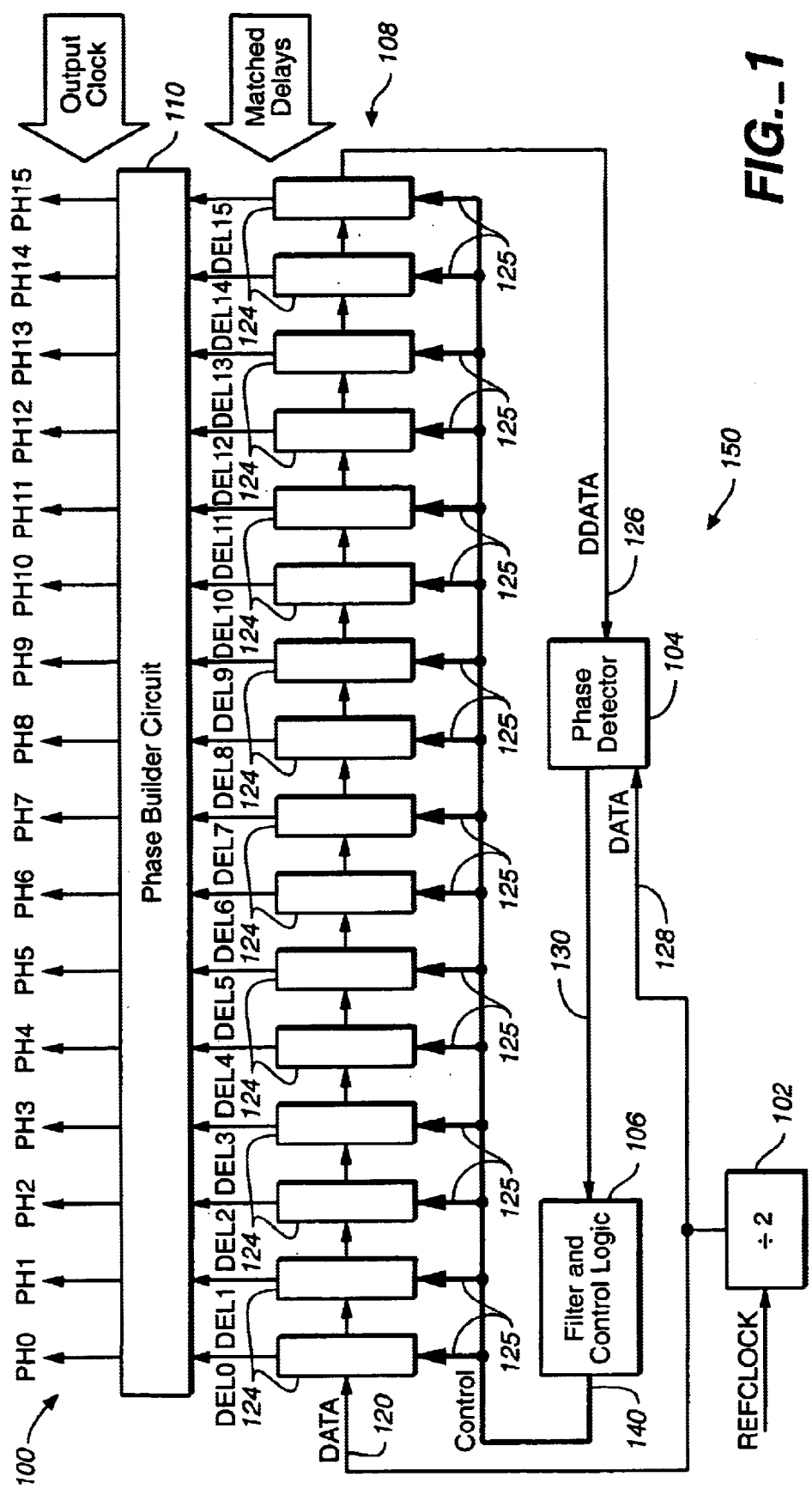
FIG._1

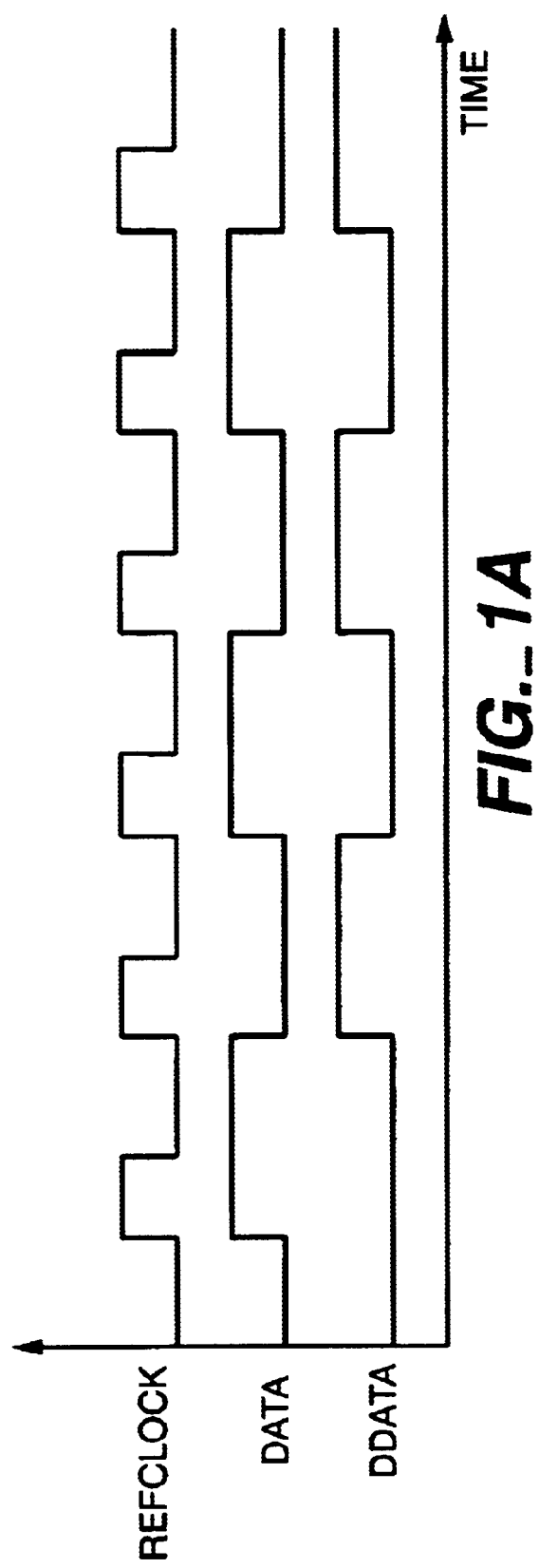
FIG._1A

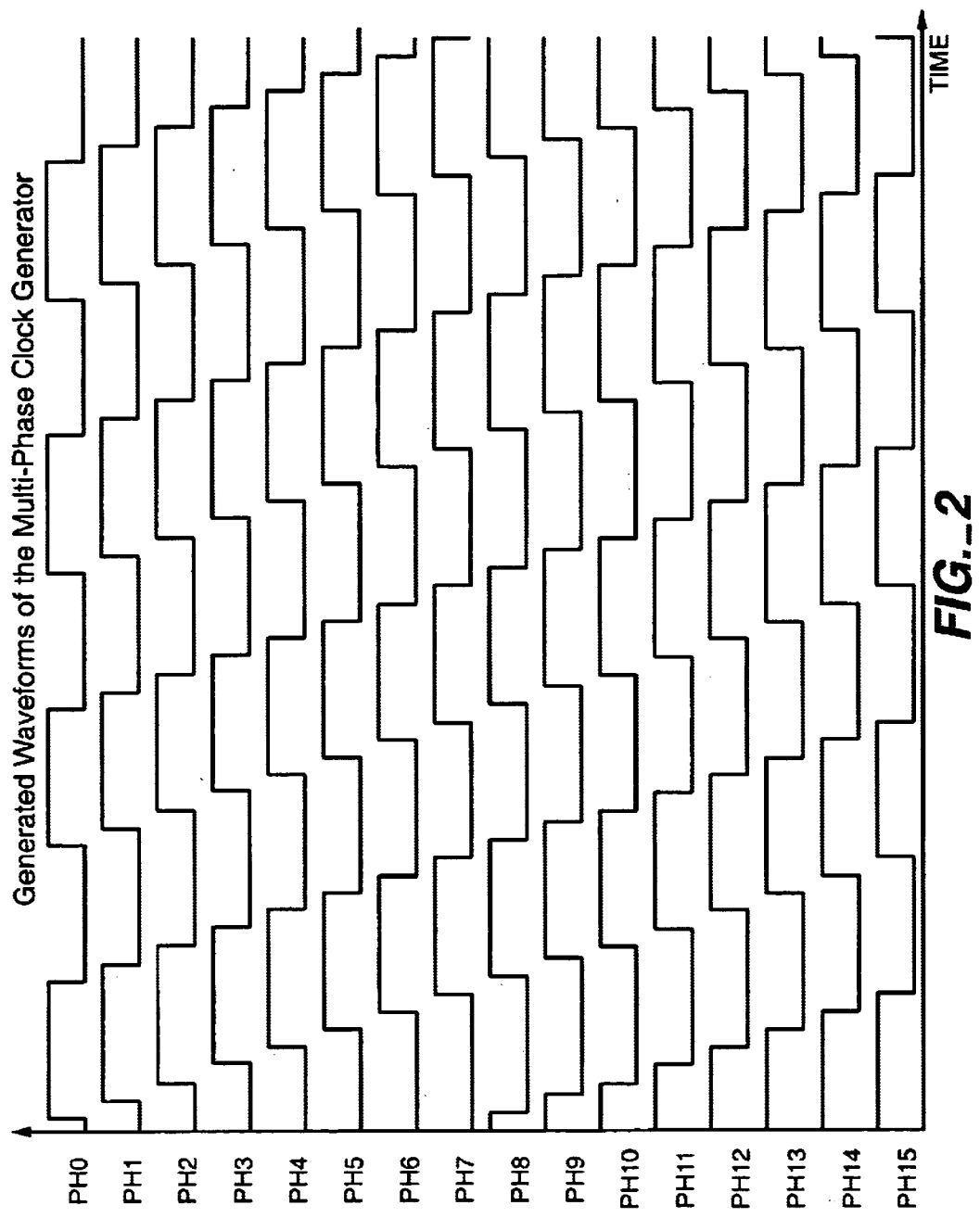
FIG._2

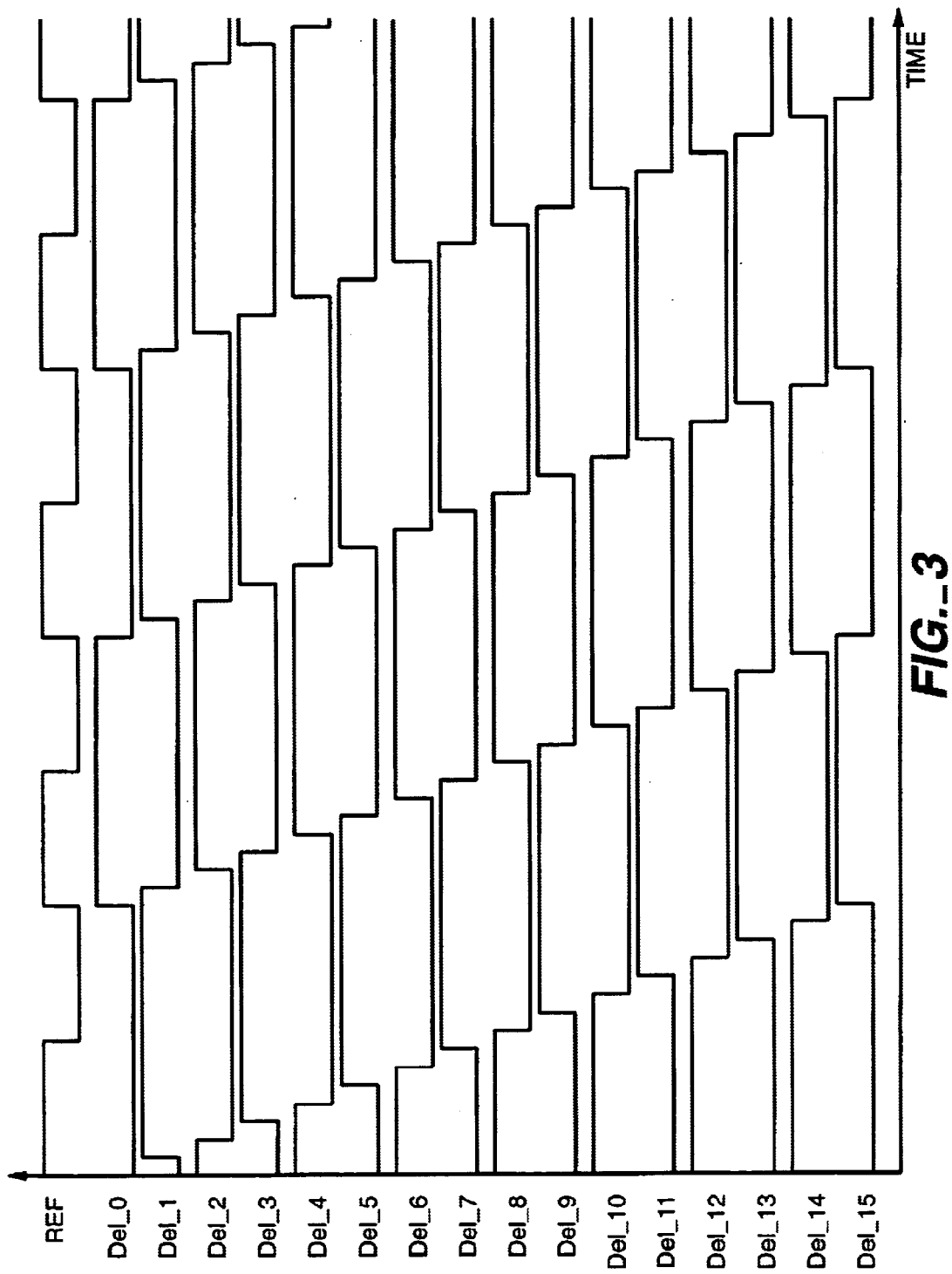
FIG._3

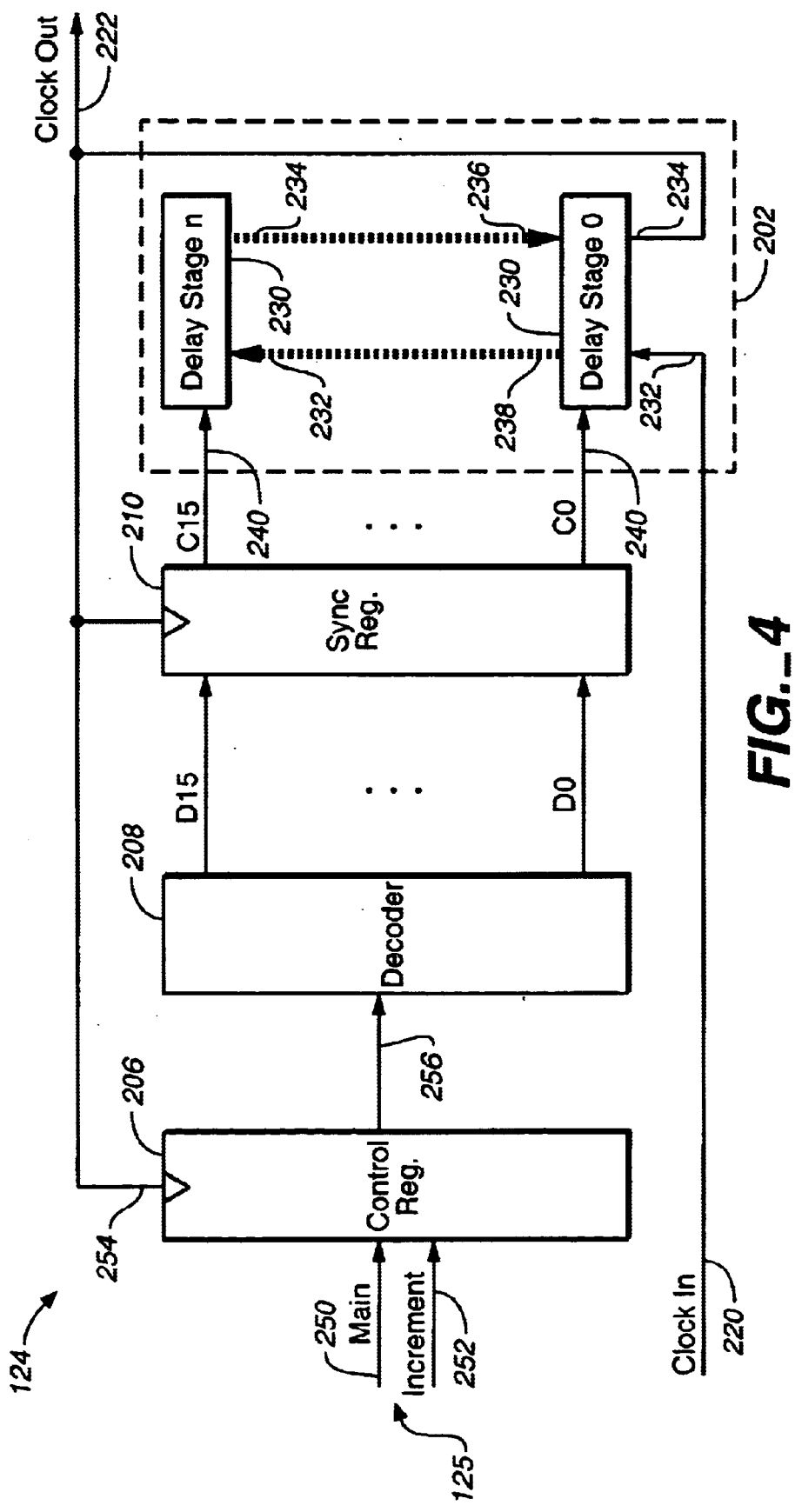
FIG._4

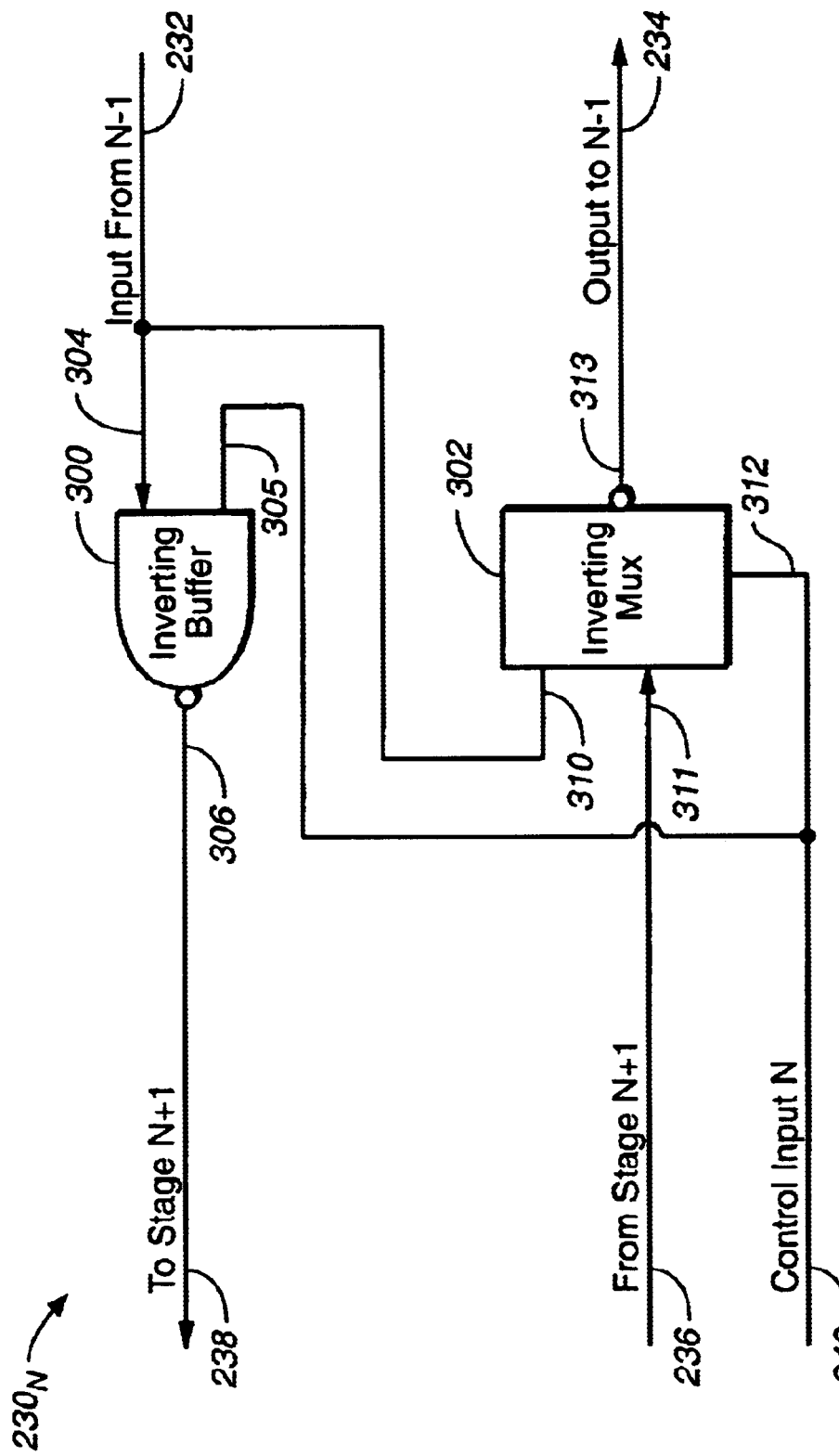
FIG._5

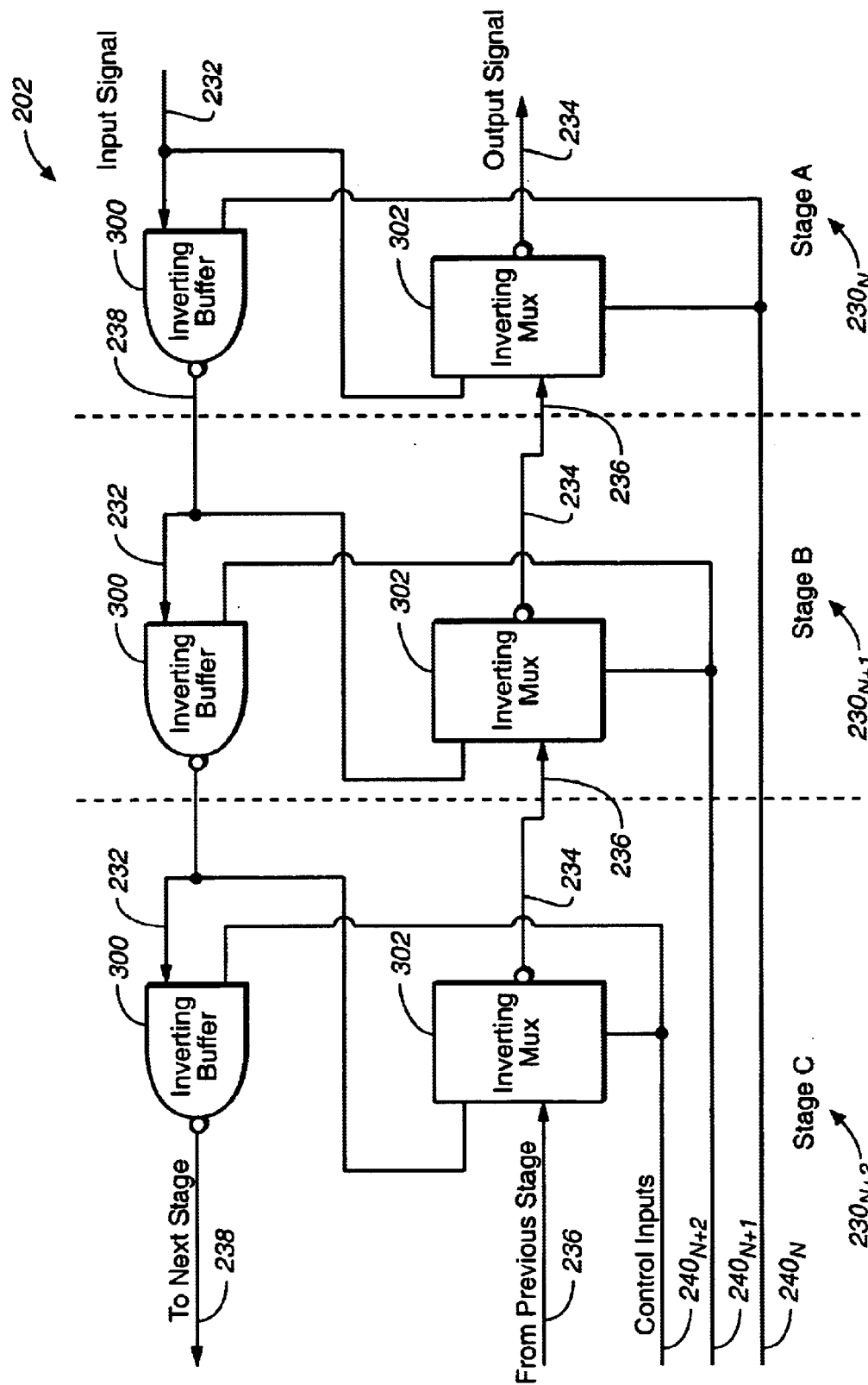
FIG._6

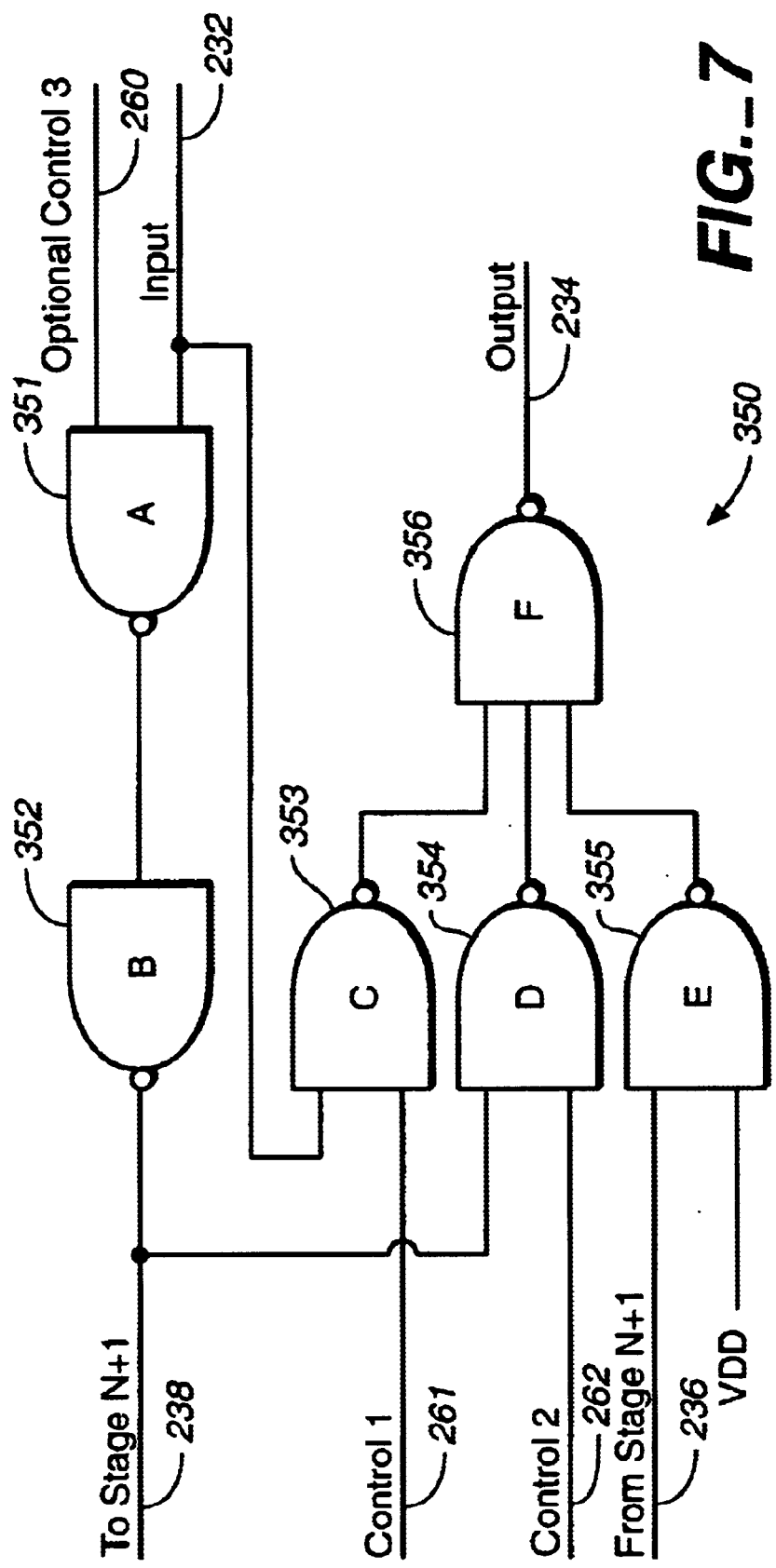
FIG._7

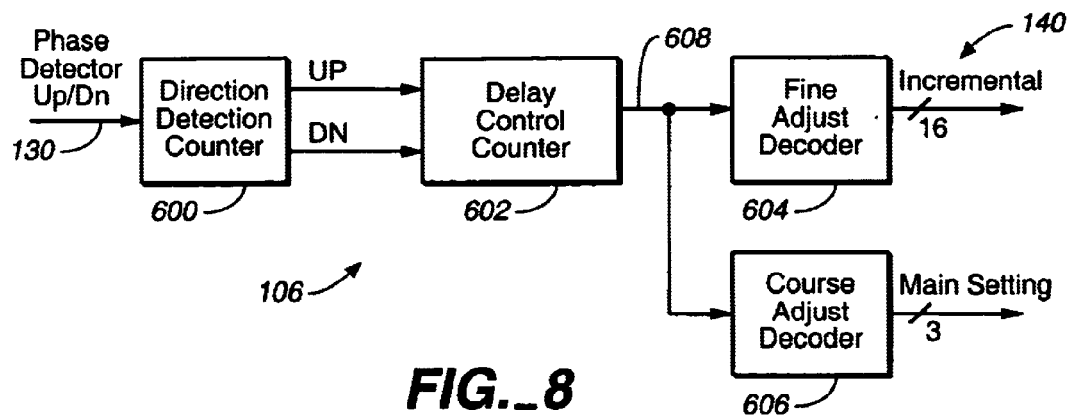
FIG._8
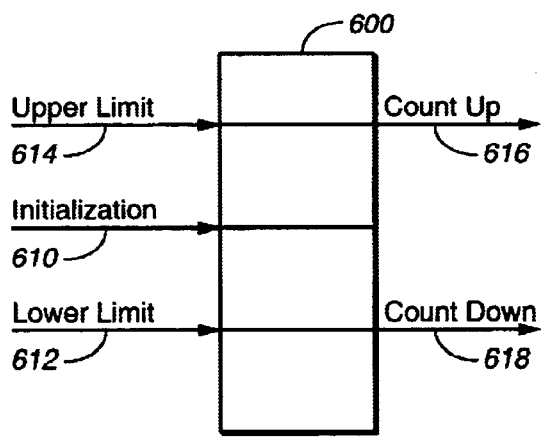
FIG._9
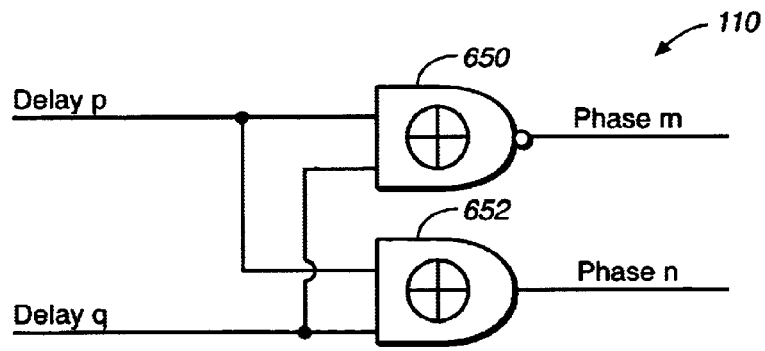
FIG._10

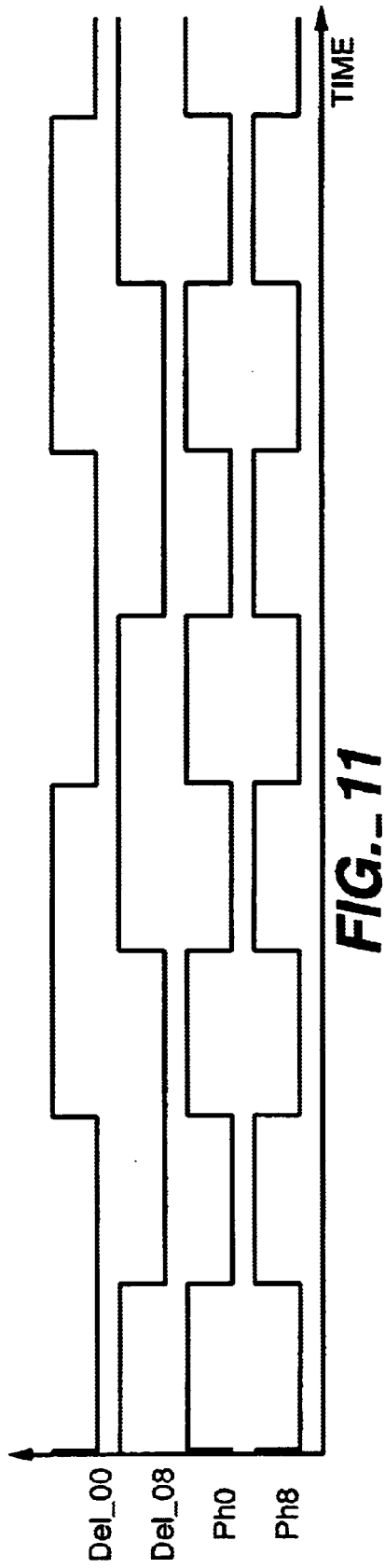
FIG._11
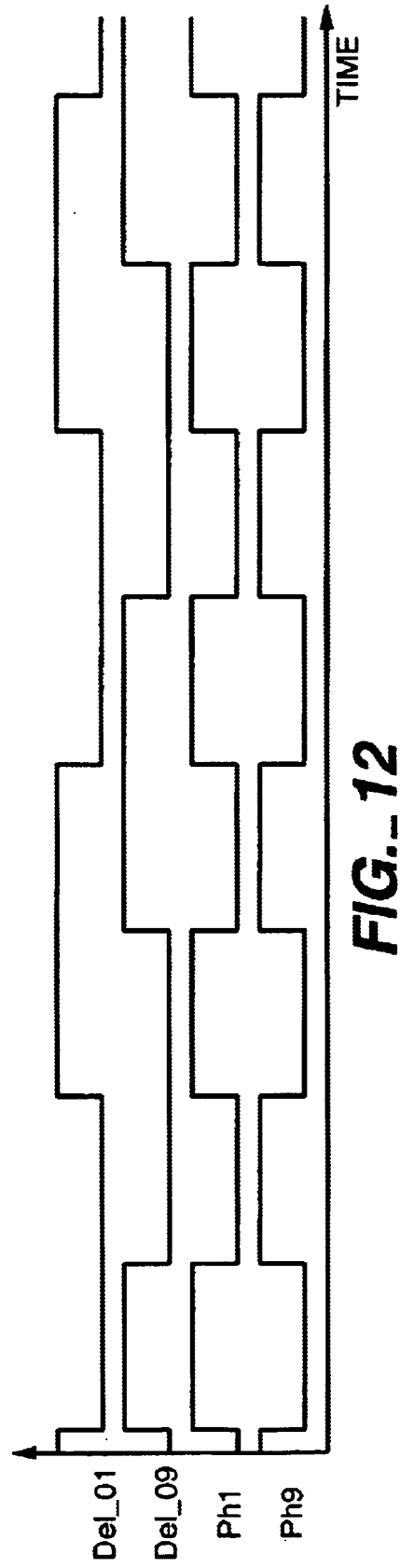
FIG._12

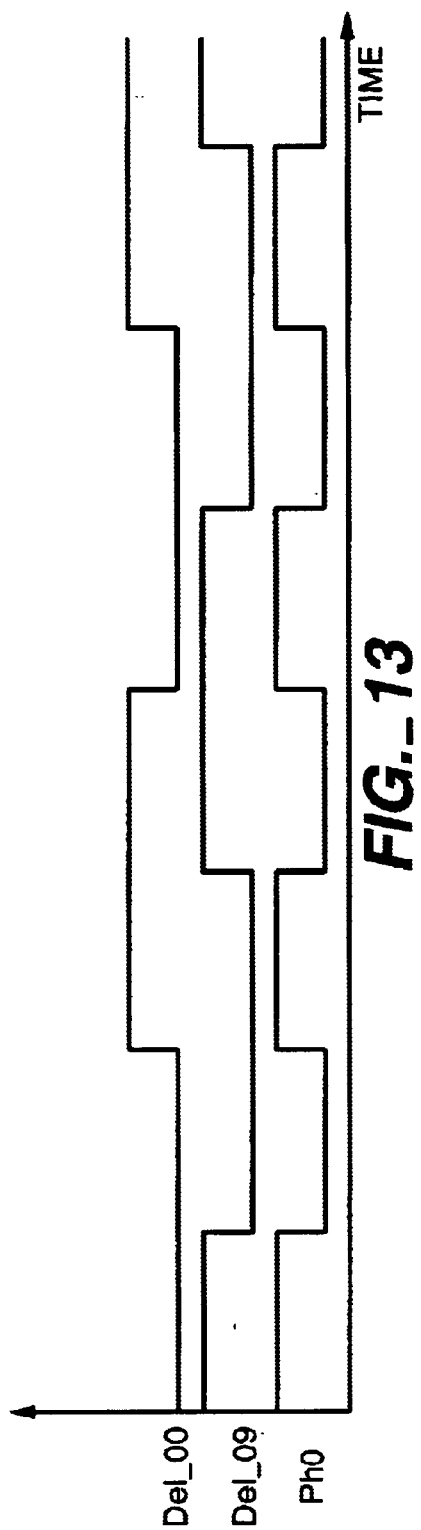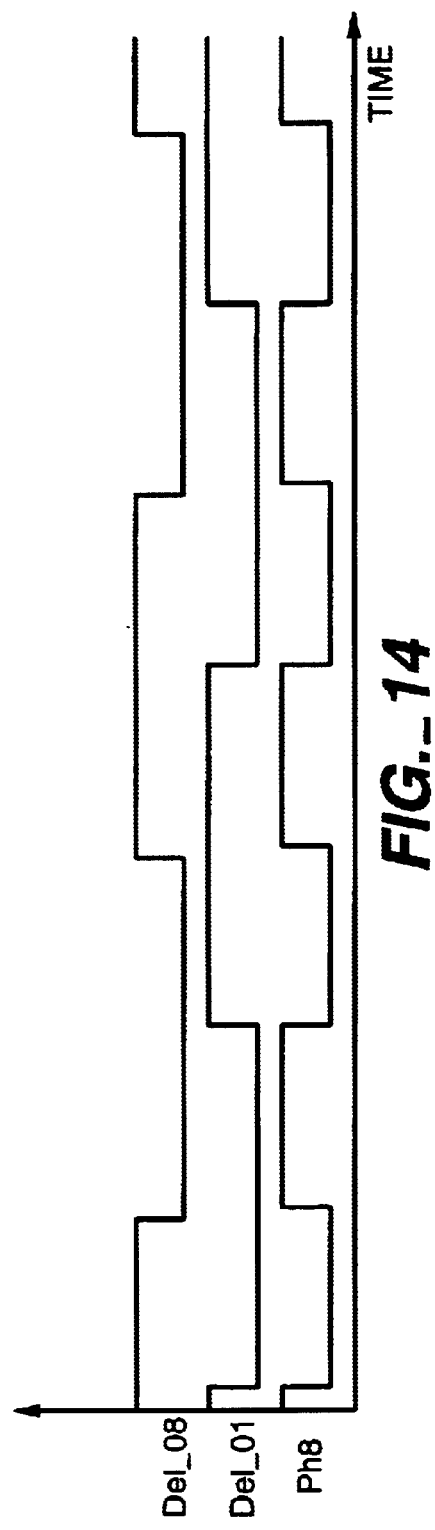

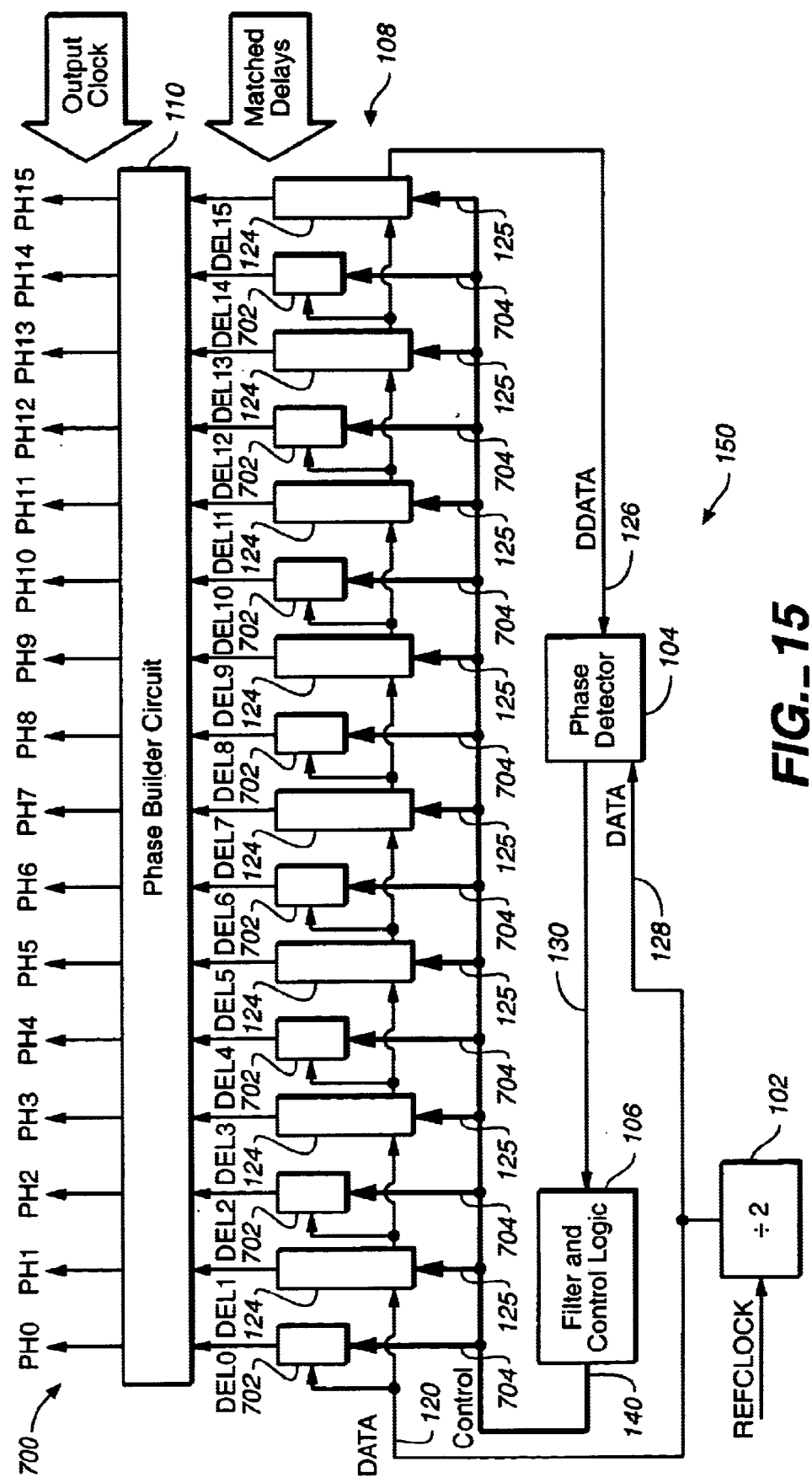
FIG._15

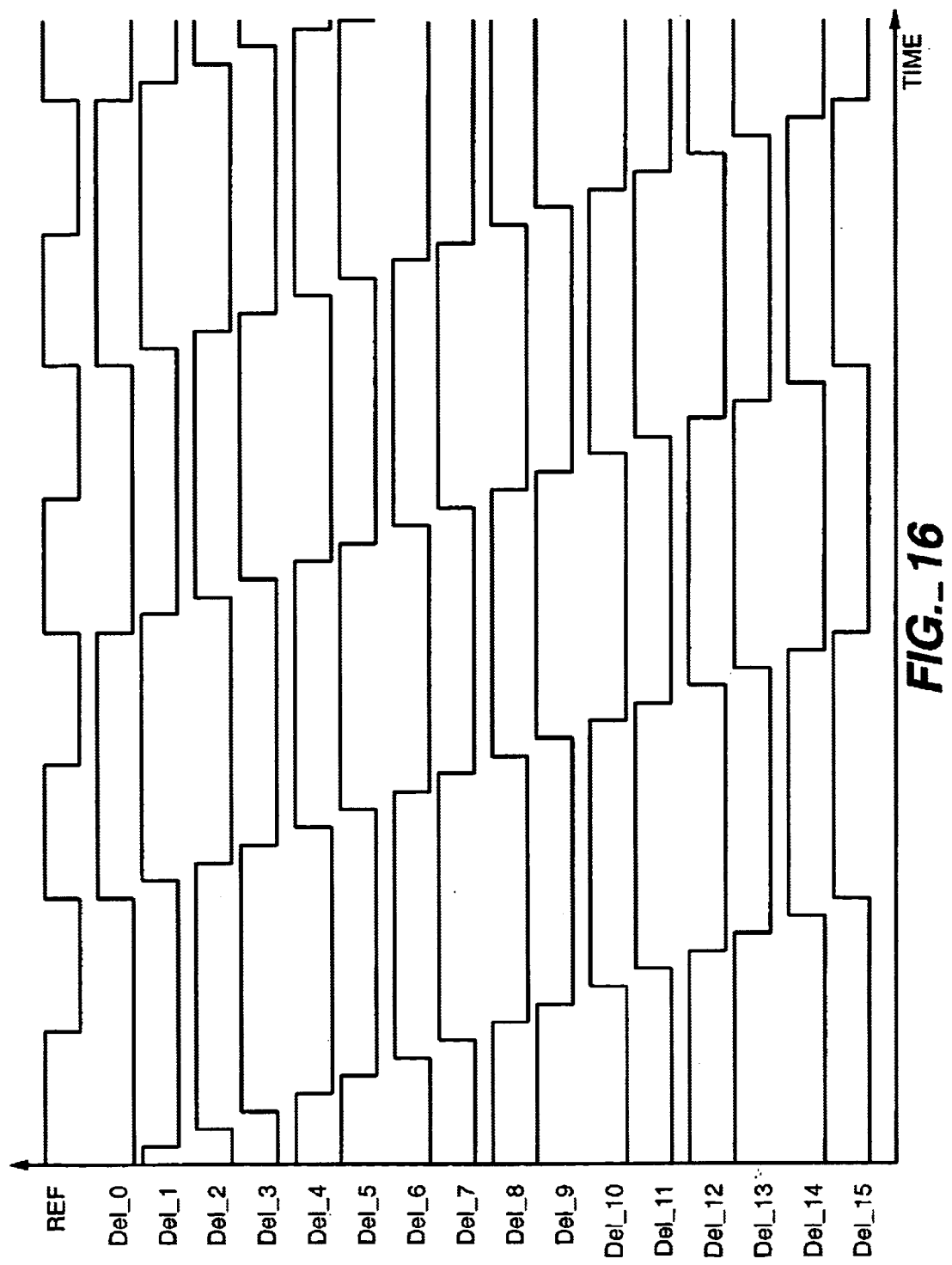
FIG._16

DIGITALLY-PROGRAMMABLE DELAY LINE FOR MULTI-PHASE CLOCK GENERATOR

FIELD OF THE INVENTION

The present invention relates to semiconductor integrated circuits and, more specifically, to a digitally-programmable delay line for use in a multi-phase clock generator, for example.

BACKGROUND OF THE INVENTION

Multi-phase clock generators have been used in semiconductor integrated circuits for a variety of different applications. One common application of a multi-phase clock generator is in telecommunications equipment for capturing data received from high-speed Asynchronous Transfer Mode (ATM) Wide Area Networks (WAN) and Local Area Networks (LAN), for example. The phase of the input data is compared with each available phase output from the clock generator. The phase output having a falling edge that coincides with the data edges is selected to control latches, which acquire the input data, in order to place the rising edge as close to the center of the data eye as possible.

A typical multi-phase clock generator generates clock signals which are equally distributed in phase over 360 degrees. An analog phase-locked loop (PLL) or ring oscillator is typically used to generate the clock signals. While analog PLLs can generate multiple clock signals that are substantially equally distributed in phase, these circuits have several disadvantages. For example if the reference clock input to the PLL stops, the PLL loses phase lock, which must be re-established when the reference clock returns. Also, analog PLL circuits are relatively sensitive to noise and interference. Analog PLLs can also be difficult to test during design and manufacturing verification.

An alternative to analog multi-phase clock generators is therefore desired, which is capable of maintaining phase lock when the reference clock stops, is easy to test, can maintain a constant duty cycle across all phases, and is relatively insensitive to changes in process, voltage and temperature.

SUMMARY OF THE INVENTION

One embodiment of the present invention is directed to a digitally programmable delay circuit, which includes a control input and a plurality of delay stages coupled in series with one another to form a delay line. Each stage has a previous stage input, a previous stage output, a next stage input and a next stage output. The next stage output and the next stage input are coupled to the previous stage input and the previous stage output, respectively, of a next one of the delay stages in the delay line. The previous stage input is coupled to the next stage output. The previous stage input and the next stage input are selectively coupled to the previous stage output based on the control input.

Another embodiment of the present invention is directed to a digital multi-phase clock generator. The clock generator includes a reference clock input, a plurality of delay outputs having different phases from one another, and a plurality of programmable delay circuits coupled to the reference clock input, in series with one another. Each delay circuit generates one of the delay outputs and comprises a delay control input, a programmable delay, and an input load that is independent of the programmable delay. A phase detector and a delay control circuit are coupled to the plurality of delay circuits to form a digital phase-locked loop, which locks a phase of one of the delay outputs to a phase of the reference clock input. The delay control circuit has a digital delay control output coupled to the delay control inputs of the delay circuits.

BRIEF DESCRIPTION OF THE DRAWINGS

FIG. 1 is a block diagram of a digital multi-phase clock generator according to one embodiment of the present invention.

FIG. 1A is a waveform diagram illustrating the waveforms, REFCLOCK, DATA and DDATA, within the generator shown in FIG. 1 over time.

FIG. 2 is a waveform diagram illustrating the waveforms produced on phase outputs PH0–PH15 of the generator over time.

FIG. 3 is a waveform diagram illustrating the waveforms produced on delay outputs DEL0–DEL15 within the generator over time.

FIG. 4 is a block diagram illustrating a delay macro within the generator in greater detail according to one embodiment if the present invention.

FIG. 5 is a schematic diagram illustrating one of the delay stages used in the delay macro shown in FIG. 4 in greater detail according to one embodiment of the present invention.

FIG. 6 is a schematic diagram illustrating three of the delay stages shown in FIG. 5 connected in series with one another according to one embodiment of the present invention.

FIG. 7 is a schematic diagram illustrating a delay stage according to an alternative embodiment of the present invention.

FIG. 8 is a block diagram, which illustrates a filter and control logic circuit in greater detail according to one embodiment of the present invention.

FIG. 9 schematically illustrates a direction detection counter in greater detail according to one embodiment of the present invention.

FIG. 10 is a schematic diagram illustrating a phase builder within the generator for generating a pair of the phase outputs from a pair of the delay outputs according to one embodiment of the present invention.

FIG. 11 is a waveform diagram illustrating the generation of phase outputs PH0 and PH8 from delay outputs DEL0 and DEL8 with the phase builder shown in FIG. 10.

FIG. 12 is a waveform diagram illustrating the generation of phase outputs PH1 and PH9 from delay outputs DEL1 and DEL9 with the phase builder shown in FIG. 10.

FIG. 13 is a waveform diagram illustrating the generation of alternative phase output PH0 from delay outputs DEL0 and DEL9.

FIG. 14 is a waveform diagram illustrating the generation of alternative phase output PH8 from delay outputs DEL1 and DEL8.

FIG. 15 is a block diagram of an interleaved digital multi-phase clock generator according to an alternative embodiment of the present invention.

FIG. 16 is a waveform diagram illustrating the waveforms produced on delay outputs DEL0–DEL15 within the generator shown in FIG. 15 over time.

DETAILED DESCRIPTION OF ILLUSTRATIVE EMBODIMENTS

FIG. 1 is a block diagram of a digital multi-phase clock generator 100 according to one embodiment of the present invention. In the example in shown in FIG. 1, dock generator 100 receives an input reference clock (labeled REFCLOCK) and generates 16 clock outputs (labeled PH0–PH15) which are substantially equally distributed in phase over 360 degrees. In alternative embodiments of the present invention, clock generator 100 can be modified to generate any number of clock phases.

Clock generator 100 includes frequency divider 102, phase detector 104, filter and control logic 106, digitally-programmable delay line 108 and phase builder circuit 110. Frequency divider 102 divides REFCLOCK by two, for example, to provide a 50% duty cycle that eliminates any dependency of clock generator 100 on the duty cycle of REFCLOCK. The divided signal produced by frequency divider 102 is labeled DATA. DATA is coupled to input 120 of delay line 108. Delay line 108 includes a plurality of matched delay macros 124, which are connected in series with one another. In this example there are 16 delay macros 124 in delay line 108. The output of each delay macro 124 is connected to the input of the next subsequent delay macro 124 in delay line 108. Delay macros 124 are constructed identically to one another and each have a delay control input 125.

The output of the last delay macro 124 in delay line 108 (labeled "DDATA") is coupled in a feedback loop to feedback input 126 of phase detector 104. FIG. 1A is a waveform diagram illustrating the waveforms REFCLOCK, DATA and DDATA over time. Referring back to FIG. 1, phase detector 104, filter and control logic 106 and delay line 108 are coupled together to form a digital phase-locked loop (PLL) 150. Phase detector 104 has a reference input 128, which is coupled to the output of frequency divider 102 to receive the non-delayed signal, DATA. Phase detector 104 compares the phase of the falling edge of DATA with the phase of the rising edge of DDATA and responsively generates UP/DOWN phase control signals on phase control output 130. However, any suitable edge can be used for phase detection in alternative embodiments. The UP/DOWN phase control signals are representative of a difference between the phase of DATA relative to the phase of DDATA. Phase control signals UP/DOWN can have any suitable format and can have any suitable number of bits, such as one bit.

In one embodiment, phase detector 104 applies a logic HIGH signal on phase output 130 when the phase of the DDATA lags the phase of DATA to indicate that the phase of DDATA should be advanced. Similarly, phase detector 104 provides a logical LOW signal on phase output 130 when the phase of DDATA leads the phase DATA to indicate that the phase of DDATA should be delayed. For example if DDATA is still LOW at the rising edge of DATA, delay line 108 is too long and must be shortened. If DDATA is already HIGH at the rising edge of DATA, delay line 108 is too short and must be extended. Delay line 108 has the correct delay when the rising edge of DATA coincides with the falling edge of DDATA.

Filter and control logic 106 receives the UP/DOWN phase control signals from phase control output 130 which, when suitably filtered, are used to control the delay settings of the delay macros 124 within delay line 108. Filter and control logic 106 has a control output bus 140, which is labeled CONTROL and is coupled to the control inputs 125 of delay macros 124. Control output bus 140 is a multi-bit control bus having a first set of bits defining a main delay setting value and a second set of bits defining respective incremental delay setting values for each delay macro 124. The main delay setting value is applied in parallel to all delay macros 124. Each incremental delay setting value is applied individually to its respective delay macro 124 to permit a fine adjustment of the total delay through delay line 108. For example, the control output bus 140 can have three bits for defining the main delay setting value, and one bit for each delay macro 124 for defining the incremental delay setting value for that delay macro. In this embodiment, control output bus 140 has a total of 19 bits. However any number of bits can be used in alternative embodiments.

As phase detector 104 compares the phase of DATA to the phase of DDATA, filter and control logic 106 selectively increments and decrements the main and incremental delay settings of delay macros 124 to advance and retard the phase of DDATA. Once PLL 150 has locked DDATA onto the phase of DATA, phase outputs PH0–PH15 are synchronized with REFCLOCK and are roughly equally distributed in phase over 360 degrees, in one example of the present invention.

FIG. 2 is a waveform diagram, which illustrates the waveforms generated on phase outputs PH0–PH15 when PLL 150 is in a locked state. In general, each phase output PH0–PH15 is located halfway between the next preceding phase output and the next subsequent phase output. In the case of the phase difference between phase output PH15 and phase output PH0, this phase difference may not be exactly equal to the other phase differences since it contains that part of the clock cycle which cannot be absorbed by an increase or decrease in the settings of a single matched delay macro. In one embodiment, the range of this phase step is between 0 and 2 increments, because filter and control logic 106 is configured to avoid changing the delay settings until a full-sized increment or decrement is needed, for example. In alternative embodiments, the range can be larger or smaller.

The outputs of delay macros 124 define 16 phase-distributed delay outputs DEL0–DEL15. In one embodiment, each delay macro 124 is inverting so that duty cycle distortion is cancelled from one macro to the next. If macros 124 were non-inverting, this distortion would accumulate along delay line 108. For a particular gate, the transition delay from input to output for a rising edge is different from that of a falling edge. While this difference is usually small, the difference can accumulate along a long line of these gates causing duty cycle distortion. The use of inverting delay macros tends to cancel-out the transition delay differences.

FIG. 3 is a waveform diagram, which illustrates the waveforms generated on delay outputs DEL0–DEL15 relative to REFCLOCK ("REF") with delay macros 124 being inverting. Phase builder circuit 110 receives delay outputs DEL0–DEL15 and combines the delay outputs to convert them into the desired phase outputs PH0–PH15. As described in more detail below with reference to FIGS. 10–14, selected pairs of DEL0–DEL15 are combined to form each of the phase outputs PH0–PH15. The delay outputs DEL0–DEL15 are delayed copies of the "divide by two" signal DATA. Although the REFCLOCK was divided at the input, phase outputs PH0–PH15 are at the reference frequency. In one embodiment, pairs of DEL0–DEL15 that are 90 degrees out-of-phase with one another can be exclusive-OR'ed to generate individual phase outputs. It is also possible to generate a higher frequency on phase outputs PH0–PH15 by selecting different combinations of delay outputs DEL0–DEL15 to form the phase outputs. In clock generators that generate a different number of phases, the choice of suitable combinations of delay outputs will lead to the generation of similar phase outputs. In particular situations, other phase output waveforms may be desired, such as overlapping or non-overlapping phases outputs.

These phase outputs can be generated with similar phase building circuits 110, but with different combinations of delay outputs to generate the desired signals.

When filter and control logic 106 passes the main and incremental delay settings to delay macros 124, these control signals are resynchronized to the logic in the delay macros. Resynchronization is desired since each delay macro operates at its own phase shift from the DATA input. These resynchronization stages are not shown in FIG. 1, but can be employed at each phase quadrant in the circuit, for example. In one embodiment, resynchronization registers are placed (counting from phases 0 to 15) in control bus 140 between the delay macros for phases 3 and 4, between the delay macros for phases 7 and 8, and between the delay macros for phases 11 and 12. For example, delay macros 124 in phases 0–3 receive control signals that are registered using phase output PH8. Delay macros 124 in phases 4–7 receive control signals that are registered using phase output PH12. Delay macros 124 in phases 8–11 receive control signals that are registered using phase output PH0. Delay macros 124 in phases 12–15 receive control signals that are registered using phase output PH4. This provides adequate setup time to avoid glitches due to changing the control settings, and the changes occur during the logic "0" phase of the clock signal. Without these resynchronization stages, the control signal edges can collide with the propagated DATA signal causing metastability and thus undefined conditions within the delay line and control logic.

FIG. 4 is a block diagram illustrating one of the delay macros 124 in greater detail. Delay macro 124 includes digitally-programmable delay line 202, control register 206, decoder 208 and synchronizing register 210. Delay line 202 has an input 220 (labeled "Clock In") which is coupled to the next preceding delay macro 124 in delay line 108 and an output 222 (labeled "Clock Out") which is coupled to the next subsequent delay macro 124 delay line 108.

Delay line 202 has a plurality of delay stages 230 which are connected together in series with one another, wherein the signal applied to Clock In 220 passes through progressively more of the delay stages 230, from Clock In 220 to Clock Out 222, as the number delay stages that are enabled is increased. Each delay stage 230 has a previous stage input 232, a previous stage output 234, a next stage input 236, a next stage output 238, and a delay control input 240. For each delay stage 230, the next stage output 238 and the next stage input 236 are coupled to the previous stage input 232 and the previous stage output 234, respectively, of a subsequent next one of the delay stages 230 in delay line 202.

Within each delay stage 230, the previous stage input 232 is coupled to next stage output 238 through a controlled buffer. In addition, either previous stage input 232 or next stage input 236 is selectively coupled to previous stage output 234 based on the delay control input 240 applied to that stage.

With this structure, it is possible to operate delay line 202 with any useful length. Also, delay line 202 has a constant input loading capacitance on Clock In 220 regardless of the number delay stages that are enabled and regardless of the number of enabled stages in the delay line. The input clock signal is fed from one delay stage 230 to the next so that the only input loading is that of the first delay stage. The propagation delay through the first delay stage 230 defines the maximum frequency of operation.

Control register 206 has main delay setting input 250 and an incremental delay setting input 252, which together form control input 125. Control register 206 also has a clock input 254 coupled to clock output 222 from delay line 202. As mentioned above, main delay setting input 250 has three bits, and incremental delay setting input 252 has one bit. The main and incremental delay settings are latched in control register 206 at the rising edge of clock output 222. This synchronizes the application of the delay settings for this delay macro 124. The latched output of control register 206 is coupled to input 256 of decoder 208. In one embodiment, decoder 208 has 16 decoded outputs D0–D15. There is one decoded output D0–D15 for each corresponding delay stage 230 in delay line 202.

In one embodiment, decoder 208 is a variation of a "thermometer decoder", which converts the four-bit binary value received on input 125 to a binary code on outputs D0–D15. The number of logic "1's" on outputs D0–D15 is a function of the binary value provided to input 125. The number of outputs D0–D15 that have a "1" determines the number of delay stages 230 and 240 in delay lines 202 and 204 that are connected in series with one another. Like a thermometer decoder, the outputs having a "1" always start at D0 with no intervening "0's". In the embodiments of the delay stages shown in FIGS. 5–7, any output after the first "0" is a "don't care" because the clock signal is disabled from being propagated within the delay line beyond the first "0" control input. Other types of decoders can also be used.

Decoded outputs D0–D15 are applied to the inputs of synchronizing register 210, which synchronizes the control information on outputs D0–D15 to the rising edge of clock output 222. Synchronizing register 210 has 16 control outputs labels C0–C15, which are applied to respective delay control inputs 240 of delay stages 230. In delay line 202, the clock signal received on Clock In 220 is routed from input 232 to output 238 of each delay stage 230 for which a "1" has been applied to its control input 240.

In one embodiment of the present invention, the first delay stage 230 in delay line 202 that receives a logic "0" on its control input 240 routes the clock signal received on its previous stage input 232 to its previous stage output 234 and blocks the clock signal from being passed to the next delay stage in the line. For example, if C0–C3 are a "1" and C4–C15 are a "0" then the clock signal received on Clock In 220 would pass serially through the first four delay stages 230 to the fifth delay stage 230 and then back through the first four delay stages 230 to Clock Out 222.

No toggling signal is passed to subsequent stages in the delay line. Thus, all stages subsequent to the first stage that receives a "0" control signal are effectively "disabled" and do not have logic states that toggle with the clock signal. Thus, these unused stages consume only leakage current. Also, the states of the delay control inputs 140 applied to the stages subsequent to the first stage that receives a "0" control signal need not be defined. This can simplify the generation of the delay control signals C0–C15 and thus the complexity of decoder 208.

FIG. 5 is a schematic diagram illustrating one of the delay stages $230_N$ in greater detail, where "N" is a variable ranging from 0 to 15 in the above-example. Delay stage $230_N$ includes a controlled buffer 300 and a multiplexer 302. In the embodiment shown in FIG. 5, controlled buffer 300 is an inverting buffer, formed of with a logic NAND gate. However, other types of buffers can also be used, such as a logic NOR gate with appropriate inversions of delay control inputs 240. Buffer 300 has a first input 304 coupled to previous stage input 232, a second input 305 coupled to delay control input 240 and an inverted output 306 coupled to next stage output 238. Multiplexer 302 is an inverting multiplexer, which includes a first data input 310 coupled to previous stage input 232, a second data input 311 coupled to next stage input 236, a select input 312 coupled to delay control input 240, and an inverted output 313 coupled to previous stage output 234. As shown in FIG. 4, previous stage input 232 and previous stage output 234 are coupled to next stage output 238 and next stage input 236 of the previous stage ($230_{N-1}$) in the delay line. Next stage output 238 and next stage input 236 are coupled to previous stage input 232 and previous stage output 234 of the next stage ($230_{N+1}$) in the delay line.

During operation, controlled buffer 300 selectively transports the input signal on previous stage input 232 to the following stage on next stage output 238 as a function of the logic state of delay control input 240. Multiplexer 302 selectively couples either previous stage input 232 or next stage input 236 to previous stage output 234 as a function of the logic state of delay control input 240.

When delay control input 240 is low, controlled buffer 300 blocks the input signal from reaching next stage output 238, and multiplexer 302 passes the input signal from previous stage input 232 to previous stage output 234. When delay control input 240 is high, controlled buffer 300 passes the input signal from previous stage input 232 to next stage output 238, and multiplexer 302 passes the signal received from next stage input 236 to previous stage output 234.

FIG. 6 is a diagram illustrating the hook-up of multiple delay stages $230_N$, $230_{N+1}$, and $230_{N+2}$ within delay line 202. Stages $230_N$, $230_{N+1}$, and $230_{N+2}$ are labeled Stage A, Stage B and Stage C, respectively. The input signal to delay line 202 is applied to Stage A, and the output signal from delay line 202 is taken from Stage A. When control signals $240_N$:$240_{N+2}$ are in the "110" state, the input signal is transported (and inverted) through multiplexer 302 of Stage A to the output 234 of Stage A. When the control signals are in the "101" state, the "1" applied to Stage C, following the "0" applied to Stage B is a "don't care". The input signal is passed through buffer 300 of Stage A to multiplexer 302 of Stage B, from there to the multiplexer 302 of Stage A and then inverted to output 234 of Stage A. When the control signals are in the "011" state, the input signal is passed through buffers 300 of Stages A and B to multiplexer 302 of Stage C and then back through multiplexers 302 of Stages B and A.

In the first case with the control signals in the "110" state, the propagation delay through delay line 202 is the transition time through a single multiplexer in Stage A. In the second case with the control signals in the "101" state, the delay is the sum of the transition times through one buffer and two multiplexers. In the third case with the control signals in the "011" state, the delay is the sum of the transition times through two buffers and three multiplexers. The number of delay stages 230 can be increased indefinitely without affecting the behavior of the first delay stage. As mentioned above, the states of all control signals to the left of the first stage having a "0" delay control input need not be defined. This reduces complexity of the decoder. Since all unused delay stages are inactive, unnecessary power consumption is avoided.

The overall behavior of delay line 202 is to delay the input signal, invert it and pass it to the output. Although each buffer and mutliplexer inverts its input, the total number of inversions is odd. The physical construction of this delay line makes the cascading multiple delay stage instances into a longer delay line very simple. Even with a very long delay chain, the inputs and outputs will remain in the same respective positions, making their identical hook-up a simple task.

The delay stages shown in FIGS. 5 and 6 are provided as examples only, and can be modified in alternative embodiments of the present invention. For example, the controlled buffer 300 can be replaced with a simple inverter coupled between previous stage input 232 and next stage output 238. In this embodiment, subsequent unused delay stages would not be blocked from toggling with the input signal. Other modifications can also be made.

For example, FIG. 7 is a diagram which illustrates a delay stage 350 according to a further alternative embodiment of the present invention. The same reference numerals are used in FIG. 7 as were used in FIGS. 5 and 6 for the same or similar elements. Delay stage 350 includes logic NAND gates 351–356 (labeled A–F). NAND gate 351 has a first input coupled to previous stage input 232, a second input coupled to optional control input 260, and an output coupled to the input of NAND gate 352. The output of NAND gate 352 is coupled to next stage output 238. NAND gate 353 has a first input coupled to previous stage input 232, a second input coupled to control input 261 and an output coupled to a first input NAND gate 356. NAND gate 354 has a first input coupled to previous stage output 238, a second input coupled to control input 262, and an output coupled to a second input NAND gate 356. NAND gate 355 has a first input coupled to previous stage input 236, a second input coupled to a logic high state (VDD), and an output coupled to a third input of NAND gate 356. The output of NAND gate 356 is coupled to previous stage output 234.

Delay stage 350 is essentially two stages in one. Control input 261 gates the input signal from previous stage input 232 through NAND gate 353 to NAND gate 356. NAND gate 355 receives its input from the next stage in the chain, and passes it on to NAND gate 356. Optionally, NAND gate 351 may be controlled through control input 260 in order to reduce the power consumption in unused stages of the delay line that are not needed by the current control setting. NAND gate 355 needs no control input because its input is controlled in another delay stage. However, NAND gate 355 is implemented as a logic NAND gate in order to retain the same delay attributes as NAND gates 353 and 354. NAND gates 351 and 352 are implemented such that their combined delay (with the extra loading of the following stage) is the same as that of NAND gates 353, 354 or 355 and NAND gate 356. Other types of delay stages can also be used.

Referring back to FIG. 1, assume that filter and control logic 106 has set the main delay setting to "3" such that each of the delay macros 124 in delay line 108 uses three delay stages (230 in FIG. 4). When filter and control logic 106 determines from the up/down phase control output 130 that a small increase in delay is required to maintain phase-lock, one of the delay macros 124 will be increased to use four delay stages. Filter and control logic 106 sets the unique incremental delay setting on the control input 125 of that delay macro 124 to a "1" to indicate that the delay through that delay macro should be incremented by one delay stage. With each succeeding increase in delay, the delay through a different delay macro 124 is increased to use four delay stages until all sixteen delay macro 124 are using four stages. At this point in time, filter and control logic 106 increases the main delay setting on output 140 to require four delay stages and resets all of the unique incremental delay settings.

The order in which the delay macros 124 are increased is a predetermined order, such as a psuedo-random order. This spreads-out the increase in delay over delay line 108 rather than simply starting with the first delay macro in the line and proceeding towards the last delay macro in the line. For example if the first delay macro is labeled "0" and the last delay macro is labeled "15", the order in which the delay is increased could be 7,3,11,1,9,15,13,5,2,8,12,4,10,14,6,0. Any other order can also be used, including a sequential order from 0 to 15 or from 15 to 0. The same procedure is implemented in reverse to decrease the cycle time if needed.

FIG. 8 is a block diagram, which illustrates filter and control logic 106 in greater detail according to one embodiment of the present invention. Logic 106 includes direction detection counter 600, delay control counter 602, fine adjust decoder 604 and coarse adjust decoder 606. Phase control output 130 from phase detector 104 is coupled to the input of direction detection counter 600. Direction detection counter 600 has up and down counter control outputs UP and DN, which are coupled to the count direction inputs of delay control counter 602. Delay control counter 602 has a count output 608, which is decoded by fine and coarse decoders 604 and 606. Decoders 604 and 606 generate the incremental and main delay setting values on outputs 610 and 612, respectively, which form the delay control bus 140 shown in FIG. 1.

Phase control output 130 controls whether direction detection counter 600 counts up or down. Since phase control output 130 can only be either "1" or "0", counter 600 counts up or down at each clock edge. Counter 600 is initialized to an intermediate value and counts up or down to preset limits. In the simplest case, counter 600 counts up or down until it overflows or underflows. Counter 600 detects the overflow or underflow condition and responsively generates an up or a down control signal on output UP or DN causing the count in delay control counter 602 to increment or decrement. The use of direction detection counter 600 as a pre-scaler inhibits a constant count-up, count-down behavior in delay control counter 602. If PLL 150 is in a "locked" state, phase detector 104 will constantly supply UP control signals followed by DOWN control signals, which are averaged by direction detection counter 600.

As delay control counter 602 increments or decrements its count, the count value is decoded by decoders 604 and 606 into a main delay setting and a set of incremental delay settings. These settings are applied to each of the delay macros to increase or decrease the total delay through delay line 108 (shown in FIG. 1).

FIG. 9 schematically illustrates direction detection counter 600 in greater detail. The count in counter 600 has an initial state 610, a preset upper limit 612 and a preset lower limit 614. In one embodiment, counter 600 is a 4-bit counter, which is initialized to state "8" and has an upper limit of "12" and a lower limit of "4". When several UP requests are applied from phase detector 104, counter 600 increments up to state "12", where upper limit 614 limit has been set. This state triggers an "UP" counter control output 616, which increments delay control counter 602 (shown in FIG. 6). This causes the total delay through delay line 108 (shown in FIG. 1) to increase. At a point where the delay is almost exactly correct, this latest increment could cause phase detector 104 to produce DOWN requests during the next period of operation. Direction detection counter 600 is reset to its initialization state 610 when delay control counter 602 has been updated. Similarly, when counter 600 reaches its lower limit "4", counter 600 generates a "DN" control output 618 to delay control counter 602, which decrements the delay control counter.

In this example, the lower and upper limits 612 and 614 limits were set at values less than the full scale values of direction detection counter 600 to avoid possible overflow conditions which could cause delay control counter 602 to change state in the wrong direction. The details of the filter and control logic 106 shown in FIGS. 8 and 9 are provided as examples only. Various other control circuits could also be used, which could perform the same or different control functions.

As described with reference to FIG. 1, the delay outputs DEL0–DEL15 from the individual delay macros 124 are passed to phase builder circuit 110 for conversion into phase outputs PH0–PH15. FIG. 10 is a diagram illustrating a portion of phase builder circuit 110, which operates on a pair of delay inputs (labeled "Delay P" and "Delay Q") to generate a pair of phase outputs (labeled "Phase M" and "Phase N"). In one embodiment phase builder circuit 110 includes sets of exclusive-NOR gates 650 and exclusive-OR gates 652 for combining sets of delay outputs Delay P and Delay Q to generate sets of phase outputs Phase M and Phase N, respectively. Depending on the desired characteristics of the phase outputs, different set of the delay outputs can be combined with one another. For example, in one embodiment, each pair of delay outputs Delay P and Delay Q are 90 degrees out of phase with one another. Also, other types of logic functions can be used within phase builder circuit 110 to build the phase outputs, such as a multiplexer.

FIG. 11 is a waveform diagram illustrating the combination of DEL0 and DEL8 through exclusive-NOR agate 650 and exclusive-OR gate 652 to produce phase outputs PH0 and PH8, respectively. Phase output PH0 is generated by exclusive-NOR'ing DEL0 and DEL8, and phase output PH8 is generated by exclusive-OR'ing DEL0 and DEL8. Similarly, FIG. 12 is a waveform diagram illustrating the combination of DEL1 and DEL9 to produce PH1 and PH9.

As mentioned above, in particular situations it may be desirable to produce phase outputs PH0–PH15 with certain characteristics, such as overlapping or non-overlapping phases. Non-overlapping phase outputs are phase outputs that are never high at the same time. For active-high signals, non-overlapping phase outputs have a duty cycle of 50% or less. The normal form of phase outputs having a 50% duty cycle is called non-overlapping because the phase edges of one phase coincide with those of another phase in the "pair". Overlapping phase outputs that are active-high have a duty cycle greater than 50%.

FIGS. 13 and 14 sow the generation of overlapping phase outputs. Phase output PH0 can be built by exclusive-OR'ing delay outputs DEL0 and DEL9, as shown in FIG. 13. Phase output PH8 can be built by exclusive-NOR'ing delay outputs DEL1 and DEL8, as shown in FIG. 14. In this manner various waveforms can be generated to suit different applications. For a full set of phase outputs the input loading of each delay stage will be the same as in the generation of non-overlapping phases. FIG. 15 is a diagram illustrating a high speed, interleaved clock generator 700 according to an alternative embodiment of the present invention. The same reference numerals are used in FIG. 15 as were used in FIG. 1 for the same or similar elements. In the embodiment shown in FIG. 15, delay line 108 includes a plurality of matched delay macros 124, which are coupled in series with one another between input 120 of the delay line and input 126 of phase detector 104. However, only half of the delay macros 124 are used as compared to FIG. 1. A second set of matched delay macros 702 are interleaved with the first set of delay macros 124.

Each of the delay macros 702 receives the same clock input as a corresponding one of the delay macros 124 and generates a respective one of the delay outputs DEL0, DEL2, DEL4, DEL6, DEL8, DEL10, DEL12, and DEL14. Each delay macro 702 has a control input 704, which is coupled to control bus 140. Delay macros 702 can be constructed in a similar fashion as delay macros 124 (as shown in FIGS. 4–7), but do not require the same number of delay stages as delay macros 124. For example in one embodiment, delay macros 702 have half the number of delay stages as delay macros 124.

Using interleaved delay macros can provide a means to process a higher input signal frequency since delay line 108 is constructed with half the number of delay macros 124. If segments 124 and 702 are driven with an appropriate amount of phase shift between them, the outputs of both sets of delay macros taken together can provide the same number of clock phases at double the frequency. For example in one embodiment, delay macros 124 receive the main delay setting and the corresponding incremental delay settings. In contrast, delay macros 702 receive one-half of the main delay setting and the corresponding incremental delay settings. The resulting output phases are similar to those generated in the embodiment shown in FIG. 1.

A full set of output phases are generated even if the main and incremental delay settings are all set to 0. Even though each of the delay macros 124 and its corresponding delay macro 702 would pass the input signal through a single multiplexer in this instance, delay macros 124 drive more loads than delay macros 702, resulting in a full set of distinct phase outputs being generated. FIG. 16 is a waveform diagram, which illustrates the delay outputs DEL0–DEL15 that are generated from delay line 108 with the high-speed, interleaved clock generator shown in FIG. 15, according to one embodiment of the present invention. The interleaved mode of operation allows the production of a higher frequency range.

The digital multi-phase clock generator of the present invention permits dynamic adaptation to changes in the frequency of REFCLOCK and changes in process, voltage and temperature. Since the phase-locked loop within the generator is digital, phase lock is retained even if the incoming clock signal, REFCLOCK, stops. Filter and control logic 106 retains its count and control settings such that the same settings can be used again once REFCLOCK is reinstated. Since the clock generator is purely digital and contains no analog circuitry such as an analog charge pump, loop filter and voltage-controlled oscillator as in a traditional analog generator, the generator is very easy to test using standard design verification methodologies. The purely digital clock generator is easy to port to other technologies and is relatively insensitive to changes in process, voltage and temperature.

The clock generator of the present invention can also accept clock inputs having extreme duty cycles, while still producing a fifty percent duty cycle on the phase outputs. The semiconductor layout of each part of the delay line can be performed in such a manner that the timing performance is constant throughout the design. An individual delay stage can be built as a layout macro, which can be repeatedly placed within the layout pattern to form a segment of the delay line. The required number of segments can be aligned with one another to build the overall delay line. Delay stages such as those shown in FIGS. 4–7 allow the delay lines to be constructed with any useful length while retaining the same input loading characteristics. Clock generators constructed with these delay stages are controllable within a relatively small range simply by controlling only a short section of the delay line. The delay stages permit a power savings by inhibiting the toggling of stages that are beyond the current setting. For high frequencies, this can save a significant amount of power.

Although the present invention has been described with reference to preferred embodiments, workers skilled in the art will recognize that changes may be made in form and detail without departing from the spirit and scope of the invention. For example, the terms "high" and "low" are arbitrary terms and are interchangeable with a logical inversion of the circuit. Likewise, the term "coupled" can include various types of connections or couplings and can include a direct connection or a connection thorough one or more intermediate components.

What is claimed is:

1. A digitally programmable delay circuit comprising:
   a control input; and
   a plurality of delay stages coupled in series with one another to form a delay line, wherein each stage comprises a previous stage input, a previous stage output, a next stage input and a next stage output, wherein the previous stage input is coupled to the next stage output through a buffer and the previous stage input and the next stage input are selectively coupled to the previous stage output through a multiplexer based on the control input, and wherein the next stage output and the next stage input are coupled to the previous stage input and the previous stage output, respectively, of a next one of the delay stages in the delay line, and wherein the buffer and the multiplexer are each inverting.

2. The delay circuit of claim 1 and further comprising:
   a data input coupled to the previous stage input of a first of the delay stages in the delay line; and
   a data output coupled to the previous stage output of the first delay stage in the delay line.

3. The delay circuit of claim 1 wherein the buffer in each delay stage comprises:
   a controlled buffer having a first input coupled to the previous stage input, a second input coupled to the control input and an output coupled to the next stage output.

4. The delay circuit of claim 3 wherein the controlled buffer is selected from the group consisting of a logic NAND gate and a logic NOR gate.

5. The delay circuit of claim 1 wherein the control input of the delay line comprises multiple bits and each delay stage further comprises:
   first and second delay stage control inputs, which are coupled to first and second portions, respectively, of the control input of the delay line; and
   wherein the buffer is coupled between the previous stage input and the next stage output; and
   wherein the multiplexer couples the previous stage input, the next stage output or the next stage input to the previous stage output based on the first and second delay stage control inputs.

6. The delay circuit of claim 5 wherein each delay stage further comprises:
   a third delay stage control input, which is coupled to a third portion of the control input of the delay line, wherein the buffer comprises a first input coupled to the previous stage input, a second input coupled to the third delay stage control input and an output coupled to the next stage output.

7. The delay circuit of claim 1 wherein the delay line has a constant input loading capacitance, which is independent of the number of delay stages in the delay line and independent of the control input.

8. A digital multi-phase clock generator comprising:

a reference clock input;

a plurality of delay outputs having different phases from one another;

a plurality of programmable delay circuits coupled to the reference clock input, in series with one another, wherein each delay circuit generates one of the delay outputs and comprises a delay control input, a programmable delay, and an input load capacitance that is independent of the programmable delay;

a phase detector and a delay control circuit coupled to the plurality of delay circuits to form a digital phase-locked loop, which locks a phase of one of the delay outputs to a phase of the reference clock input, wherein the delay control circuit has a digital delay control output which is coupled to the delay control inputs of the delay circuits;

a plurality of phase outputs; and a phase builder coupled between the plurality of delay outputs and the plurality of phase outputs, which combines delay signals received on the delay outputs in combinations to generate phase signals on the plurality of phase outputs.

9. The digital multi-phase clock generator of claim 8 wherein each of the delay circuits is inverting.

10. The digital multi-phase clock generator of claim 8 wherein each of the delay circuits further comprises:

a plurality of delay stages coupled in series with one another to form a delay line, wherein each stage comprises a previous stage input, a previous stage output, a next stage input and a next stage output, wherein the previous stage input is coupled to the next stage output and the previous stage input and the next stage input are selectively coupled to the previous stage output based on the control input, and wherein the next stage output and the next stage input are coupled to the previous stage input and the previous stage output, respectively, of a next one of the delay stages in the delay line.

11. The digital multi-phase clock generator of claim 10 wherein each delay circuit further comprises:

a data input coupled to the previous stage input of a first of the delay stages in the delay line; and a data output coupled to the previous stage output of the first delay stage in the delay line.

12. The digital multi-phase clock generator of claim 10 wherein each delay stage further comprises:

a buffer coupled between the previous stage input and the next stage output; and a multiplexer, which couples the previous stage input or the next stage input to the previous stage output based on the control input.

13. The digital multi-phase clock generator of claim 12 wherein the buffer and the multiplexer are each inverting.

14. The digital multi-phase clock generator of claim 10 wherein each delay stage further comprises:

a controlled buffer having a first input coupled to the previous stage input, a second input coupled to the control input and an output coupled to the next stage output.

15. The digital multi-phase clock generator of claim 8 wherein the phase builder comprises, for each phase output:

a logic circuit having inputs coupled to a plural number of the delay outputs and an output coupled to the respective phase output, wherein the logic circuit has a logical function selected from the group consisting of an exclusive-OR, an exclusive-NOR and a multiplexer.

16. The digital multi-phase clock generator of claim 8 wherein:

the delay control input of each of the delay circuits comprises a main delay setting input and an incremental delay setting input; and the delay control output from the delay control circuit comprises a main delay setting output, which is coupled in parallel to the main delay setting inputs of the plurality of delay circuits, and a plurality of incremental delay setting outputs, which are each coupled to the incremental delay setting input of a respective one of the delay circuits.

17. The digital multi-phase clock generator of claim 8 and further comprising:

a plurality of interleaved programmable delay circuits, wherein each interleaved delay circuit has a delay input coupled to a delay input of a respective one of the first mentioned plurality of delay circuits, has a delay control input coupled to the delay control output, and generates an interleaved delay output having a phase that is interleaved between phases of two of the delay outputs from the first mentioned plurality of delay circuits.

* * * * *